United States Patent [19]

Matsumura et al.

[11] Patent Number: 5,515,618
[45] Date of Patent: May 14, 1996

[54] SUBSTRATE TRANSPORTATION SYSTEM

[75] Inventors: Masao Matsumura; Masaaki Kajiyama; Takeshi Yoshioka, all of Fujisawa, Japan

[73] Assignee: Ebara Corporation, Tokyo, Japan

[21] Appl. No.: 284,569

[22] PCT Filed: Dec. 13, 1993

[86] PCT No.: PCT/JP93/01804

§ 371 Date: Aug. 9, 1994

§ 102(e) Date: Aug. 9, 1994

[87] PCT Pub. No.: WO94/14191

PCT Pub. Date: Jun. 3, 1994

[30] Foreign Application Priority Data

Dec. 14, 1992 [JP] Japan ................... 4-353609

[51] Int. Cl.$^6$ ................... F26B 13/30
[52] U.S. Cl. ................... 34/92; 34/403
[58] Field of Search ................... 34/92, 403, 406

[56] References Cited

U.S. PATENT DOCUMENTS

| | | | |
|---|---|---|---|
| 4,129,211 | 12/1978 | Clement et al. | 206/213.1 |
| 4,171,740 | 10/1979 | Clement et al. | 206/213.1 |
| 4,231,164 | 11/1980 | Barbee | 34/92 |
| 4,464,848 | 8/1984 | Estberg | 34/92 |
| 4,584,058 | 4/1986 | Lehtinen et al. | 34/92 |
| 4,637,342 | 1/1987 | Kamiya et al. | 118/719 |
| 5,205,991 | 4/1993 | Avery et al. | 34/559 |
| 5,314,509 | 5/1994 | Kato et al. | 34/406 |
| 5,349,762 | 9/1994 | Kato et al. | 34/406 |

FOREIGN PATENT DOCUMENTS

| | | |
|---|---|---|
| 0239266A2 | 9/1987 | European Pat. Off. . |
| 0239266A3 | 9/1987 | European Pat. Off. . |
| 0640373 | 3/1995 | European Pat. Off. . |
| 53-33052 | 3/1978 | Japan . |
| 59-195838 | 11/1984 | Japan . |
| 60-167414 | 8/1985 | Japan . |
| 60-236931 | 11/1985 | Japan . |
| 63-237605 | 10/1988 | Japan . |
| 3-172221 | 7/1991 | Japan . |
| 3-265137 | 11/1991 | Japan . |
| 4-157749 | 5/1992 | Japan . |
| 4-242952 | 8/1992 | Japan . |
| 4-341591 | 11/1992 | Japan . |

*Primary Examiner*—John T. Kwon
*Attorney, Agent, or Firm*—Armstrong, Westerman, Hattori, McLeland & Naughton

[57] ABSTRACT

A substrate transporting system is presented which can prevent contamination within a sealed box, and which does not bring in contaminants from the outside environment when installing substrates in a processing apparatus connected to a clean tunnel. The substrate transporting apparatus according to the present invention includes a box for installing one or more substrates in a clean sealed atmosphere, and a box transporting apparatus for transporting the box by loading it on a carrier and through a clean sealed space of a tunnel shape, and further includes a box transfer apparatus arranged in the tunnel-shaped sealed space for transferring the box from the exterior of the sealed space to the carrier, and a substrate transfer apparatus for transferring substrates installed within the box to a substrate processing apparatus connected to the sealed space. It has a cleaning apparatus arranged within the tunnel-shaped sealed space for cleaning the outer surface of the box.

15 Claims, 7 Drawing Sheets

SUBSTRATE TRANSPORTATION SYSTEM

TECHNICAL FIELD

The present invention relates to a substrate transportation system for transporting substrates such as semi-conductor substrates or liquid crystal substrates through a clean atmosphere, suitable for use especially in manufacturing processes of semi-conductors or liquid crystals.

BACKGROUND ART

Lately, Very Large Scale Integrated Circuit elements have become more highly integrated, and require a more dust-free manufacturing system. Especially, in a transporting system, not only dust-free environment but also long service life are necessary. For this reason, a magnetic floating transporting system is being developed as a wafer transporting system for use in manufacturing apparatus for the next generation semi-conductor.

The magnetic floating transporting system first floats a carrier device loaded with wafers and holds the carrier device in a floated position by virtue of magnetic force of electric magnets, then transports the carrier device without any contacts between surroundings by utilizing a linear motor mechanism for example. Since wafers can be transported in a sealed vacuum tunnel or in a clean tunnel filled with clean nitrogen gas atmosphere without making contacts with surrounding elements, this magnetic transporting system does not generate any dust troubles and is capable of realizing a highly clean transporting system. At certain locations of the clean tunnel, the magnetic floating transporting system is combined with processing apparatus such as photo-lithography device or ion plating apparatus, and the transported wafers will be carried to these processing apparatus to be processed.

Even in such combined systems comprising the processing apparatus and the wafer transporting apparatus, wafers must be stored outside of the system, or must be stored in or carried through the ambient air while they are being moved toward other systems. The present applicant has developed a technique for storing and transporting the wafers in a tightly sealed box having a highly clean inner atmosphere such as a vacuum, and has filed a patent application therefor (Japanese Patent Application, No. Heisei-4-290817).

However, although the wafers may be retained in a tightly sealed box having a clean atmosphere, and carried through the ambient air to be moved to the tunnel-type magnetic transporting system, and transferred to and transported by a carrier arranged in a tightly sealed space, at least the outer surface of the box is carried into the clean tunnel, when they are entering the clean tunnel of the magnetic transporting system.

Therefore, although the clean tunnel of the processing apparatus and transporting system are kept in highly clean atmospheres such as vacuum, there is still a problem of generating secondary contamination sources because the box may carry into the tunnel some contaminating particles or molecules, which stick to the outer surface of the box during transportation or storage in the ambient air.

Further, since the box containing wafers in an atmosphere, such as a vacuum, does not include an exhausting apparatus, there is a problem that the vacuum will be lost gradually. Moreover, there was a problem of outer air contaminations entering through vacuum sealing materials or by leakage through walls.

DISCLOSURE OF INVENTION

The present invention was made in relation to such problems of the conventional art, and aims to present a substrate transporting system which enables to prevent contamination inside the box containing substrates, and further to prohibit the contaminants entering from exterior environment when installing the substrates into processing apparatus connected to the clean tunnels.

The present invention comprises a box for storing one or more substrates within a clean sealed atmosphere, a box transporting apparatus for transporting the box by loading the box on a carrier and moving said box through a clean sealed space of a tunnel shape, and at least one substrate processing apparatus connected to said sealed space, further comprises a box transfer apparatus arranged in said tunnel-shaped sealed space for transferring said box from the exterior of said sealed space to said carrier and a substrate transfer apparatus for transferring said substrates loaded on said box to said substrate processing apparatus.

The present invention also comprises a cleaning apparatus arranged within said tunnel-shaped closed space for cleaning the outer surface of said box.

According to the invention, since the box is transported through a tightly sealed space within the clean tunnel, cleanness of the inner space of the box is maintained, thereby enabling to supply substrates directly to the substrate processing apparatus without exposing them to ambient air. Further, since the box is transported through the clean space without any contacts with the surroundings after being cleaned by cleaning apparatus, problems do not occur that the contaminants from the exterior environment enter to the transporting system and to the substrate processing apparatus. That is, according to the present invention, the outer surfaces of the box are cleaned by the cleaning apparatus, and then the substrates are directly installed through the clean sealed atmosphere onto the processing apparatus, thereby preventing re-contamination by molecular contaminants or particle contaminants on the outer surfaces of the box.

BRIEF DESCRIPTION OF DRAWINGS

FIG. 1 (A) is a schematic diagram for illustrating the state prior to installing a box, FIGS. 1 (B) and 1 (C) show enlarged views of the box respectively. FIG. 2 (A) shows a top view of the transfer station for transferring boxes into a clean tunnel, FIG. 2 (B) shows a side view of the box grasped by an external robot hand, FIG. 2 (C) shows a perspective view of the box grasped by the external robot hand, FIG. 2 (D) shows a perspective view of the box grasped by an inner robot hand, FIG. 2 (E) shows a perspective view of the box grasped by an inner robot hand. FIG. 3 is a schematic view for illustrating the box under the process of cleaning. FIG. 4 is a schematic view for illustrating the box loaded on the carrier. FIG. 5 (A) shows a perspective view illustrating the shape of the carrier, FIG. 5 (B) shows a partial cross-sectional view of the box loaded on the carrier, FIG. 5 (C) shows a perspective view of the box loaded on the carrier. FIG. 6 is a schematic view showing the box-loaded carrier running through the tunnel.

FIG. 7 shows a schematic view showing the state when the carrier has advanced to the processing chamber, FIG. 8 shows a schematic view showing a state after the carrier has delivered a wafer to an elevator, FIG. 9 shows a state after the carrier has delivered a substrate to a processing chamber. FIG. 10 (A) is a schematic view showing the state when a robot hand grasps a box, FIG. 10 (B) is a schematic view showing the state when a robot hand has extracted a substrate from the box, FIG. 10 (C) is a schematic view showing the movement of the robot hand.

BEST MODE FOR CARRYING OUT THE INVENTION

Hereinafter, an embodiment of the invention will be described in reference to FIGS. 1 to 10.

Figure 1A:
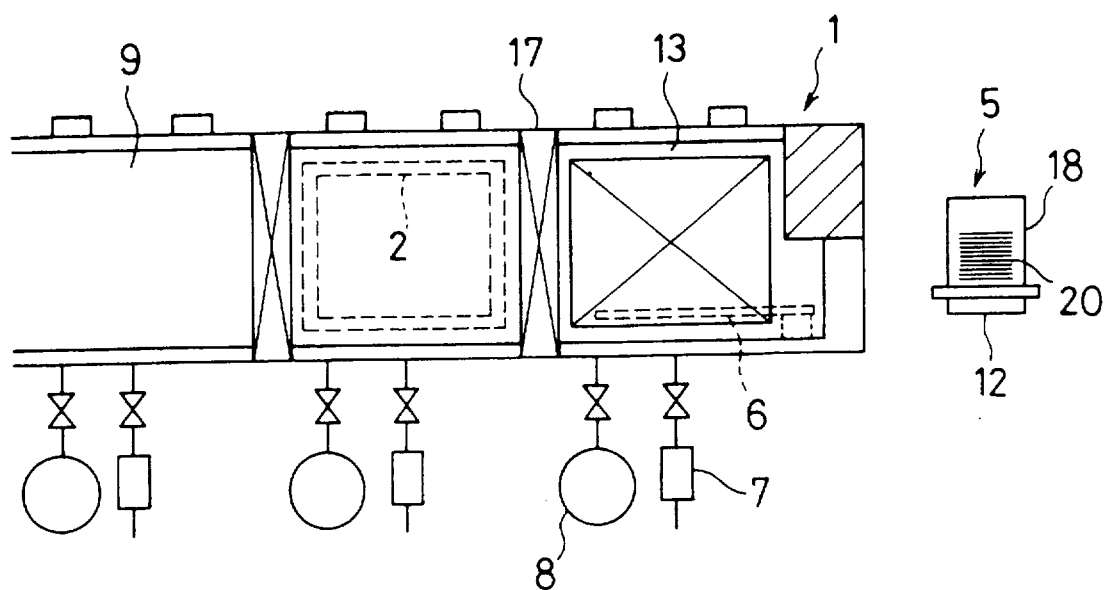
FIGS. 1 to 6 show a box transfer station for transferring boxes into a clean tunnel in a substrate transporting system of the first embodiment according to the invention.
Figure 1B:
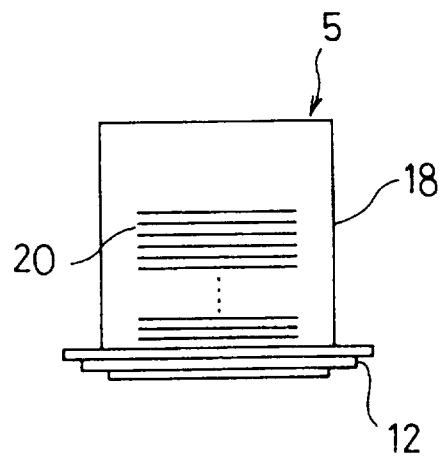
Figure 1C:
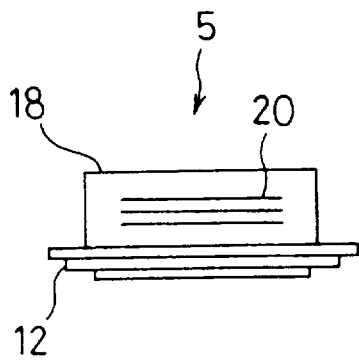
Figure 2A:
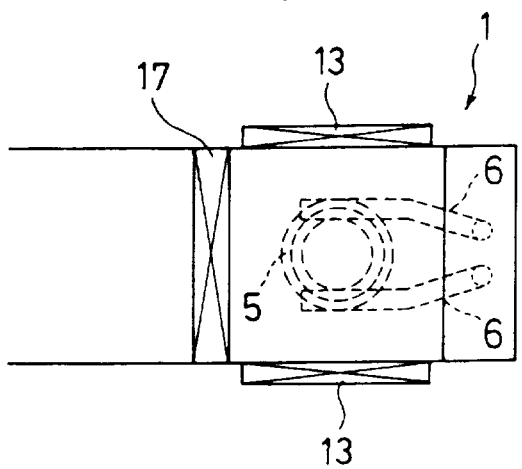
Figure 2B:
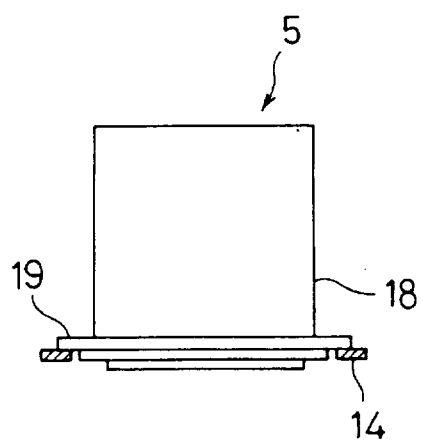
Figure 2D:
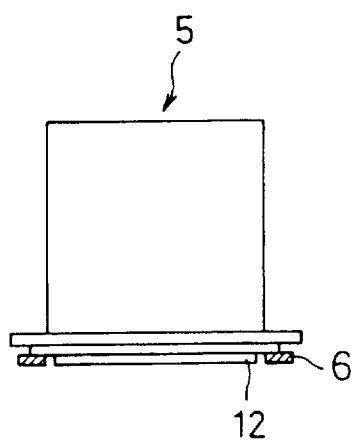
Figure 2C:
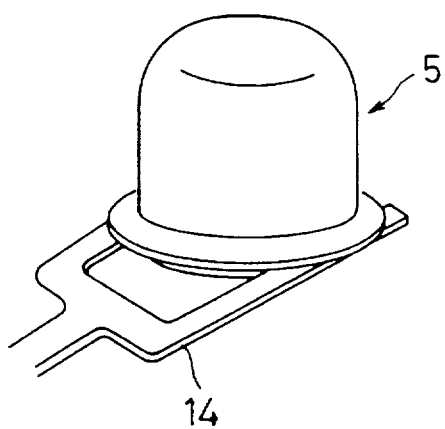
Figure 2E:
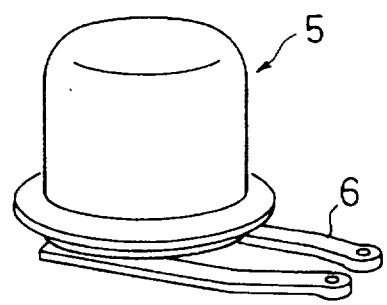

FIGS. 1 to 6 are schematic drawings for illustrating a box transferring station in a clean tunnel. The transferring station 1 is located at the extreme end of the clean tunnel 9, and transfers a box 5 outside the clean tunnel 9 to a carrier 2 inside the clean tunnel, or transfers the box 5 loaded on the carrier 2 inside the clean tunnel to the exterior of the clean tunnel 9. FIG. 1 (A) shows a state prior to the transfer of the box 5 to the clean tunnel. Here, box 5 is for containing substrates 20 such as semi-conductor wafers in a sealed clean atmosphere. FIGS. 1 (B) and 1 (C) show enlarged views of the box 5. The box 5 consists of a retainer 18 and a lid 12 within which a vacuum is maintained so that the substrates 20 are tightly sealed in a vacuum while the box 5 is carried through the ambient air. However, the inner space of the box 5 may be filled with inert gas such as nitrogen gas etc. As shown in FIGS. 1 (B) and 1 (C), the height of the retainer 18 is determined according to the number of the substrates 20 installed therein.

A device for enclosing the substrates 20 in the box 5 in a vacuum, or for taking them out of the box 5 is not illustrated here, but is disclosed in detail in Japanese Patent Application Heisei-4-290817. That is, when enclosing the substrates 20 in a closed space, the substrates 20 are placed on a plate base arranged on the lid 12 and are covered by the retainer 18. The inside space of the box 5 will be exhausted of its air through an open/close hole of the lid 12 to be kept in a vacuum. When taking substrates 20 out of the box 5 whose inner space is kept evacuated, first the open/close hole of the lid 12 is opened to break the vacuum, and then the retainer 18 is detached from the lid 12.

A valve 13 and a robot-hand 6 are devices for receiving and transferring the box 5, in which the substrates 20 are installed, to and from the inside of the clean tunnel 9. In order to transfer the box 5 into the clean tunnel 9, the valve 17 is closed first, and then the valve for leakage system 7 is opened so as to make a station 1 open to the ambient. Then the valve 13 of the station 1 is opened, and the robot-hand 6 grasps the box 5 which was placed on an external robot-hand 14 to transfer it to inside the station 1.

Figure 5A:
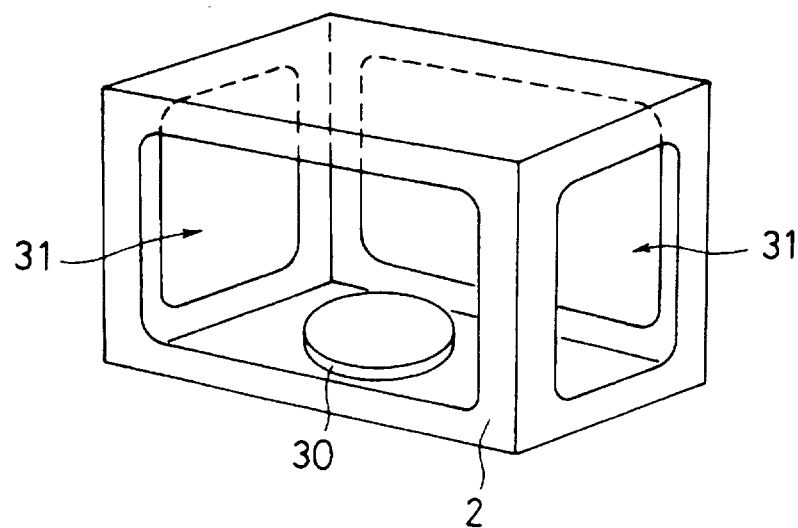
Figure 5B:
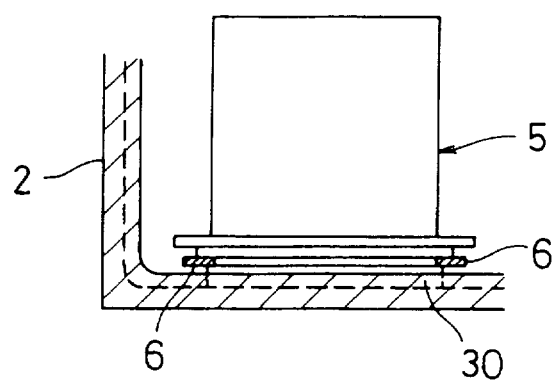
Figure 5C:
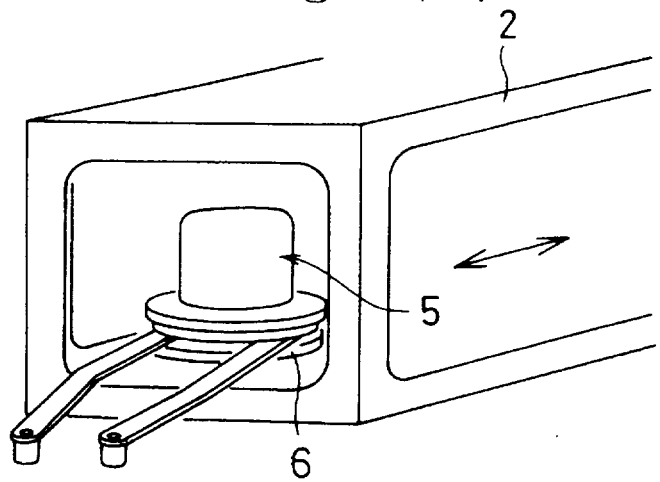

FIG. 2 illustrates the state of the station 1 when the box 5 is transferred. As FIGS. 2 (B) and 2 (C) show, a flange portion 19 of the retainer 18 of the box 5 is placed on the robot-hand 14. Then, as FIGS. 2 (D) and 2 (E) show, the robot-hand 6 within the station 1 grasps the flange portion of the lid 12 of the box 5 so that the box is transferred from the external robot-hand 14 to the internal robot-hand 6. The robot-hand 6 moves as it grasps the box 5, thereby carrying the box 5 to a central portion of the station 1 as shown in FIG. 5 (A). Then the valve 13 is closed so as to make the station 1 tightly sealed.

Figure 3:
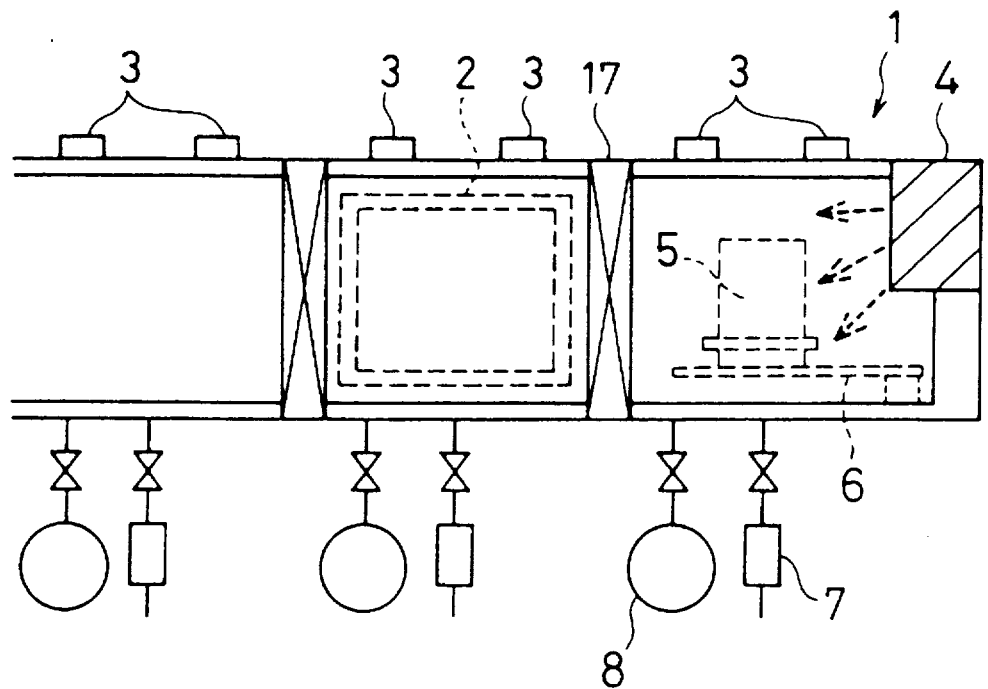

FIG. 3 shows the process of cleaning the outer surface of the box 5. The cleaning apparatus 4 is a dry (gaseous) cleaning apparatus for cleaning the outer surface of the box 5. The method of cleaning may be different depending on each process, for example, blowing clean nitrogen gas and exhausting the gas to a vacuum are alternatingly repeated to avoid contamination by particles. Vacuum exhausting is done by vacuum exhausting system 8 and a leakage system 7. To avoid molecular contamination, methods are used in which metal molecular contaminations are eliminated by virtue of activated (radical) chlorine, or surfaces are cleaned by plasma etching generated from argon gas etc. Further, to avoid contamination by organics, it is effective to use a method of cleaning by activated oxygen generated by ultra violet rays, or a method using a combination of ultra violet rays and ozone. In case of using these cleaning methods, the contaminants are removed out of the chambers by exhaustion. Utilizing other physical, chemical and physical-chemical phenomena for cleaning is possible so long as they are guaranteed to be effective and safe. Further, it is also possible to execute these processes successively, When the cleaning process is finished, a vacuum exhausting system 8 exhausts the inside of the station 1 so as to adjust the degree of vacuum to a predetermined value, and then a valve 17 is opened.

Figure 4:
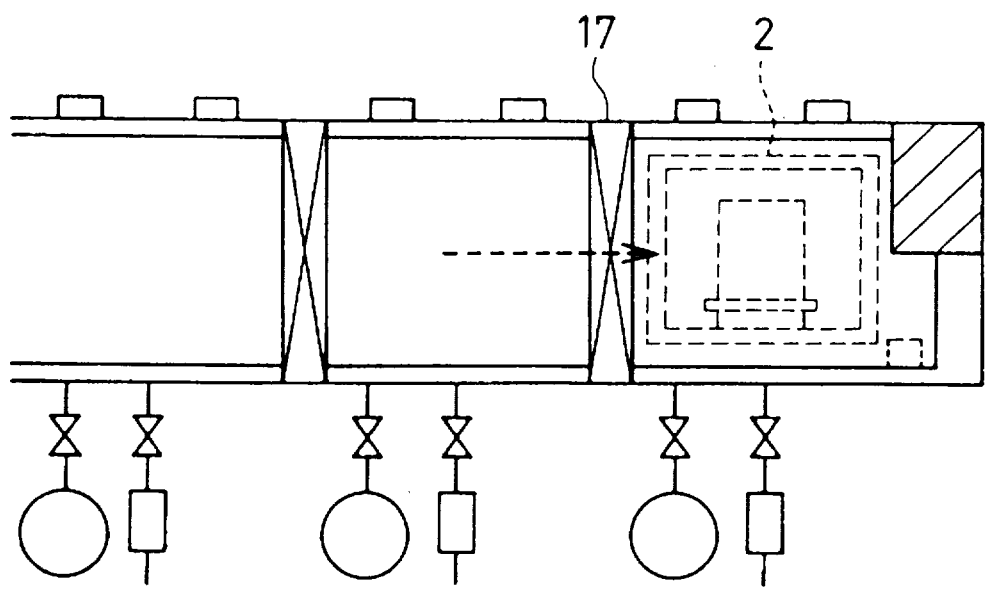

As shown in FIG. 4, the carrier 2 advances within the station 1 and transfers the box 5 to a box-receiving plate within the carrier 2 by the robot-hand, and delivers the box 5 completely to the carrier 2 by opening the robot-hand 6.

FIG. 5 illustrates the process of loading the box 5 on the carrier 2. As shown in FIG. 5 (A), the carrier 2 is formed with openings 31 at four radial directions, and is equipped with a receiving plate 30 on the bottom portion. As shown in FIGS. 5 (B) and 5 (C), carrier 2 advances and stops beneath the box 5 where the receiving plate 30 is located. The robot-hand 6 moves the box 5 downwardly, places the box on the receiving plate 30 and opens itself to transfer the box 5 to the carrier 2.

A box transporting apparatus which transports the cleaned box 5 through a clean, tightly closed space without making contacts with surrounding components is a magnetically floating transportation system. The magnetically floating transportation system is disclosed in detail in, for example, an International Patent Application PCT/JP93/00930 filed by the present applicant. The carrier 2 is supported at a floated position by virtue of magnetic attractive force of magnet pole 3 of an electro-magnet, and is driven to run with boxes 5 loaded on it, through the vacuum tunnel 9, which is a tightly sealed space, by a linear motor (not shown here).

Figure 6:
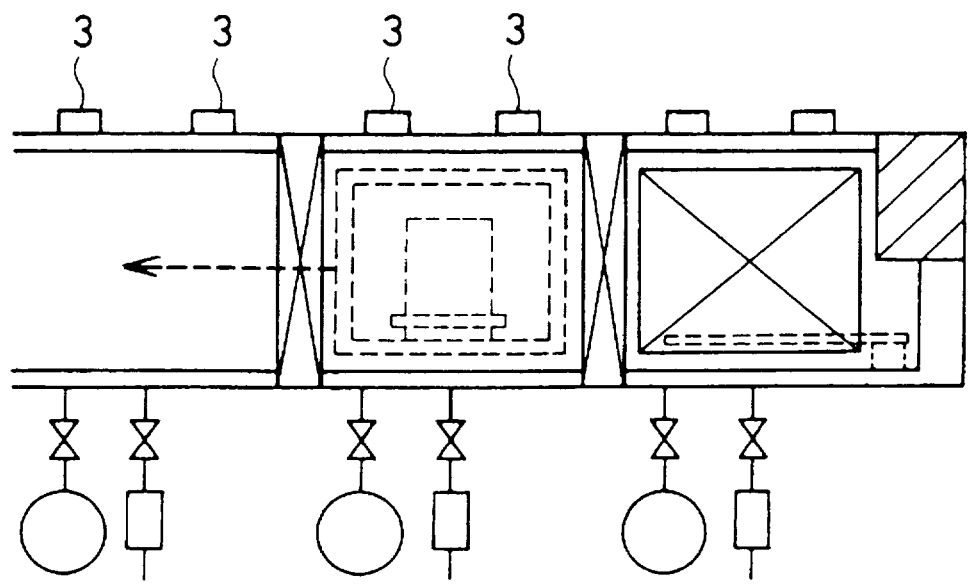

Then, as shown in FIG. 6, the carrier 2 loaded with the box 5 moves while being floated and supported by the magnetic attractive force of the magnetic pole 3 of the floating electro-magnet, without making any contacts with surroundings and without intensifying the contamination within the vacuum clean tunnel 9.

Figure 7:
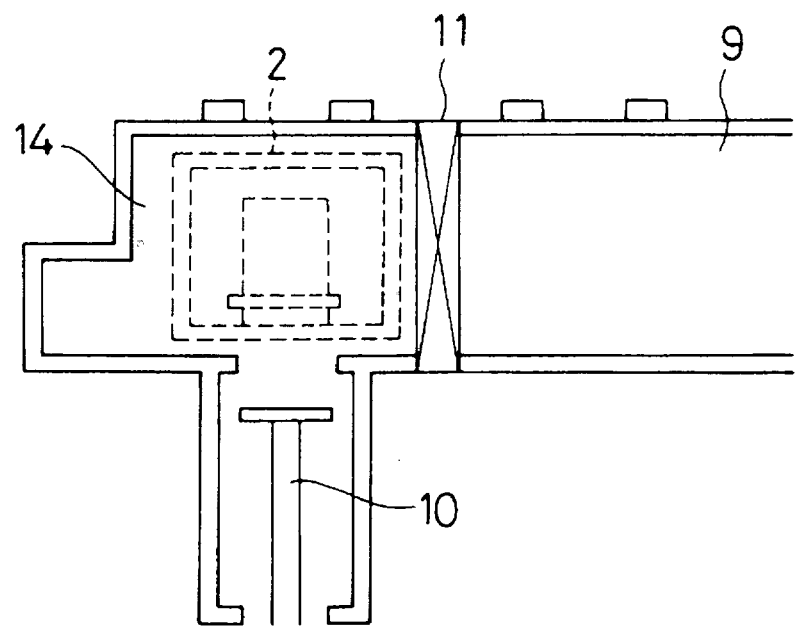
FIGS. 7 to 10 show general views of a processing chamber station of the substrate transporting system according to the embodiment of the present invention for transferring substrates into a processing chamber, in particular.

FIGS. 7 to 10 are views illustrating a processing chamber station. As shown in FIG. 7, the carrier 2 advances to the processing chamber station 14, which is next to the processing apparatus, after the valve 11 at the edge of the clean tunnel is opened. Then, the substrates are transferred from the carrier 2 to the processing station.

Figure 8:
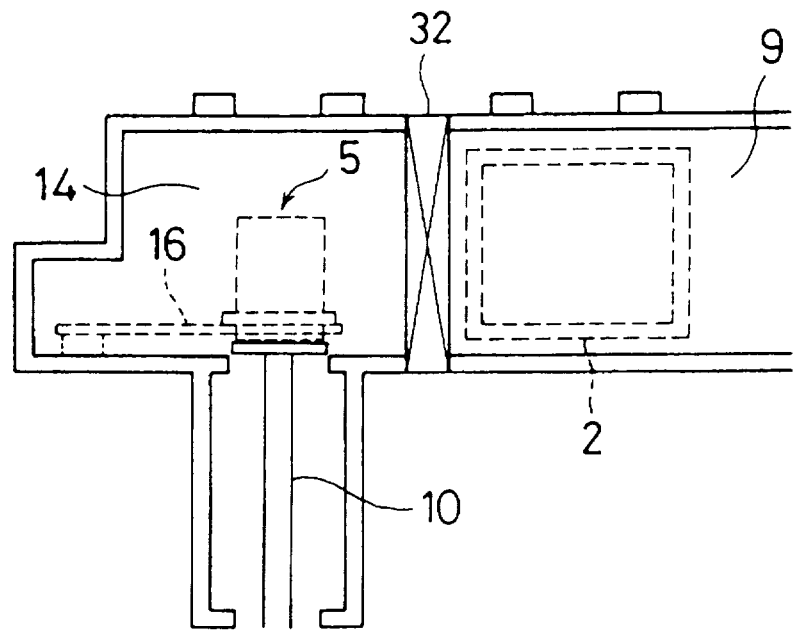
Figure 9:
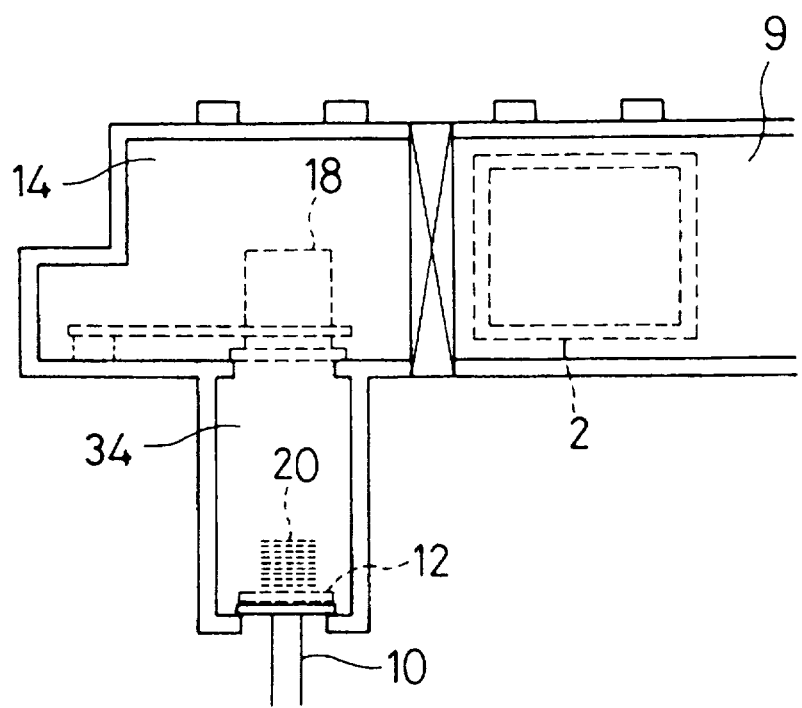
Figure 10A:
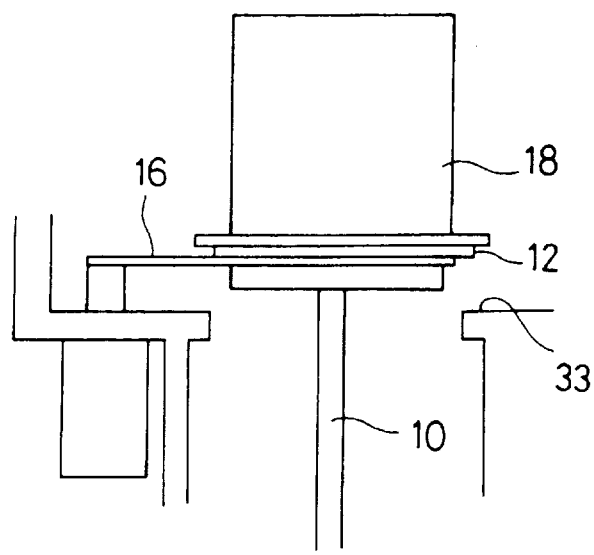
Figure 10B:
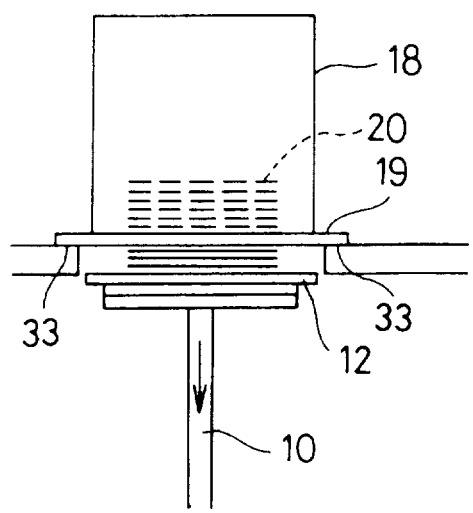
Figure 10C:
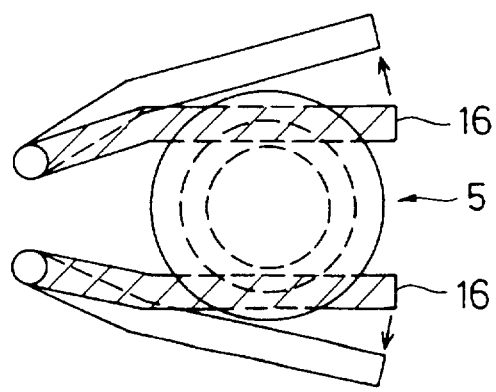

As shown in FIG. 8, at the station 14, a robot-hand 16 grasps the flange portion of the box 5, then the gate valve 32 is opened and the carrier 2 is retracted within the clean tunnel 9. FIG. 10 is a schematic view for illustrating the movement when extracting the substrates out of the box 5 containing them. The box 5 transferred to the hand 16 is shifted to the elevator 10 by elevating the elevator 10. Then, by opening the hand 16 as shown in FIG. 10 (C), the substrates 20 can be lowered along with the elevator 10. When the elevator 10 is lowered, the flange portion 19 of the retainer 18 of the box 5 is received by the bottom portion 33 of the chamber 14, and the lid 12 of the box 5 and the substrates 20 loaded thereon alone are lowered successively to be transferred onto a preliminary chamber 34 of the processing chamber as shown in FIG. 9. Here, substrates are brought into the processing chamber by a handling robot arranged within the processing chamber, thereby being treated with processes such as a photo-lithography process or an ion plating process.

Whereas the explanation above is made for the processes of transferring the box 5 through the clean tunnel 9 and transferring the substrates 20 to the processing apparatus, the substrates 20 are installed into the box 5 from the preliminary chamber 34 of the processing apparatus in a reverse manner. That is, the substrates finished with processes within the processing apparatus are returned into the box 5 at the station 14 in reverse manners as described above, and travel through the clean tunnel 9 to be sent back to the station 1. Then, the valve 13 is opened and the box 5 is returned to the ambient air by the robot hand 16. The box 5 is then carried to be treated with next process or to be stored.

It is desirable to have a vacuum atmosphere within the sealed spaces of both the box and the clean tunnel, however, the inner space of the clean tunnel may be filled with a nitrogen gas atmosphere which is effective to prevent involvement of the contaminants such as water ($H_2O$) within the box.

Otherwise, it is possible to make the inner space of the box a nitrogen gas atmosphere, however, it is inferior to a vacuum atmosphere in cleanness and safeness. Further, if the inner space of the clean tunnel is made a vacuum, the inside of the box will be at a high pressure so that the lid fixing apparatus of the box becomes more complicated.

A description was given for the substrate transporting system of an embodiment according to the present invention, in relation with semi-conductor substrates, however, the present invention is applicable in the same manner to the transporting system of liquid crystal substrates in manufacturing processes of liquid crystals. The present embodiment was described by using the magnetic floating transporting apparatus, but this invention is applicable to usual transporting apparatus using wheels instead of the magnetic floating apparatus. Further, by arranging a storing apparatus connected to the substrate transporting system according to the present invention, the present invention is applicable to a storage process of the substrates as well as processing of the substrates. Thus, modifying variations of the embodiments are possible within the aspect of the technical concept of the present invention.

Industrial Applicability

As described above, according to the substrate transporting system of the present invention, substrates are sealed in a box having a clean inner atmosphere, and carried through a clean tunnel so that they can be transferred to processing apparatus directly. Further, it comprises a cleaning apparatus for cleaning the outer surface of the box, and a box transporting apparatus for transporting the cleaned box through an isolated clean space without any contacts, thereby maintaining cleanness of the box. Therefore, compared to the conventional methods of transporting substrates such as a sealed box through ambient air, or substrates exposed to the atmosphere of a clean tunnel, the present transporting system is far more capable of preventing contamination of the substrates during transportation. Thus, it is efficient for improving the yield when applied to semi-conductor manufacturing or liquid crystal manufacturing process.

We claim:

1. A substrate transporting system, comprising:
   a box which is sealed for storing one or more substrates therein and an enclosed clean sealed atmosphere therein,
   a box transporting apparatus for transporting said box by loading said box on a carrier apparatus and moving said box through a clean sealed space having a tunnel shape,
   at least one substrate processing apparatus connected to said sealed space,
   a box transfer apparatus arranged in said tunnel-shaped sealed space for transferring said box from the exterior of said sealed space to said carrier apparatus, and
   a substrate transfer apparatus for transferring said substrates installed within said box to said substrate processing apparatus.

2. A substrate transporting system according to claim 1, wherein the internal space of said box is a vacuum.

3. A substrate transporting system according to claim 1, wherein said tunnel-shaped sealed space is a vacuum.

4. A substrate transporting system according to any of claims 1 to 3, further comprising a cleaning apparatus arranged within said tunnel-shaped sealed space for cleaning the outer surface of said box.

5. A substrate transporting system according to claim 4, wherein said cleaning apparatus is a dry-type cleaning apparatus.

6. A substrate transporting system according to claim 5, wherein said dry-type cleaning apparatus utilizes one or more of cleaning methods selected from the group consisting of gas plasma etching with an argon-containing gas, an activated chlorine-containing gas, ultra violet rays and a combination of ultra violet rays and ozone.

7. A substrate transporting system according to any of claims 1 to 3, wherein said box transporting apparatus for transporting said box through said tunnel-shaped clean sealed space is a magnetic floating transporting apparatus.

8. A substrate transporting system according to any of claims 1 to 3, wherein said substrates are semi-conductor wafers.

9. A substrate transporting system according to any of claims 1 to 3, wherein said substrates are liquid crystal substrates.

10. A substrate transporting system according to claim 1, wherein said box includes a retainer portion and a lid and a flange portion; and said box transfer apparatus includes a robot hand within a transfer station of said clean sealed space, said robot hand being capable of holding said box at said flange.

11. A substrate transporting system according to claim 10, wherein said clean sealed space also includes a processing chamber station having a robot hand which removes said box from said carrier.

12. A substrate transporting system according to claim 1, wherein the internal space of the box is an inert atmosphere.

13. A substrate transporting system according to claim 1, wherein the internal space of the box is an inert atmosphere having nitrogen gas.

14. A substrate transporting system according to claim 1, wherein said tunnel-shaped sealed space is an inert atmosphere.

15. A substrate transporting system according to claim 1, wherein said tunnel-shaped sealed space is an inert atmosphere having nitrogen gas.

* * * * *